US Patent [19] 4,388,344
Shuskus et al. [45] Jun. 14, 1983

[54] METHOD OF REPAIRING SURFACE DEFECTS IN COATED LASER MIRRORS

[75] Inventors: Alexander J. Shuskus, West Hartford, Conn.; Melvyn E. Cowher, East Brookfield, Mass.

[73] Assignee: United Technolgies Corporation, Hartford, Conn.

[21] Appl. No.: 297,899

[22] Filed: Aug. 31, 1981

[51] Int. Cl.³ .......................... G02B 1/10; G02B 5/08
[52] U.S. Cl. ...................................... 427/38; 350/310; 427/140; 427/142; 427/39; 427/162; 427/166; 427/167
[58] Field of Search ................. 427/39, 140, 142, 162, 427/166, 167; 350/310

[56] References Cited

U.S. PATENT DOCUMENTS 4,191,788  3/1980  Harrington ........................... 427/86
4,289,797  9/1981  Akselrad ............................... 427/39

OTHER PUBLICATIONS

Rosler, "Plasma Enhanced CVD in a Novel LPCVD-Type System" Solid State Technology, vol. 24, No. 4, Apr. 1981, pp. 172–177.

Primary Examiner—John D. Smith
Attorney, Agent, or Firm—Harry J. Gwinnell

[57] ABSTRACT

A method of repairing an intermediate amorphous silicon and/or germanium bond coat on a laser mirror substrate is described. The initial coating is put down by polishing the mirror substrate followed by depositing a layer of amorphous silicon, amorphous germanium, or mixtures thereof on the mirror surface, and polishing the thus coated mirror surface to a substantially void-free surface finish. A layer of oxide of silicon or germanium is deposited on the thus formed coating either during, after, or in sandwich fashion during the formation of such intermediate bond coat. The intermediate coating can be surface polished back to the original amorphous layer or the oxide can remain on the surface after polishing.

10 Claims, 6 Drawing Figures

1250 X

FIG. 1
FIG. 4           1250 X
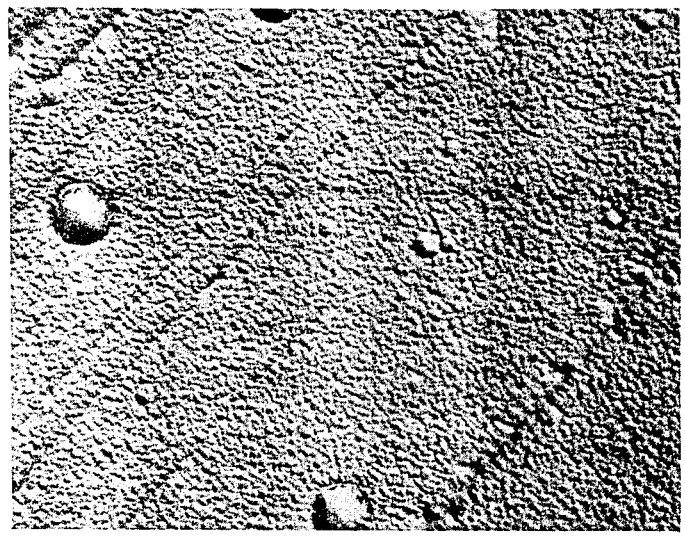
1250 X

METHOD OF REPAIRING SURFACE DEFECTS IN COATED LASER MIRRORS

DESCRIPTION

Technical Field

The field of art to which this invention pertains is composite optical elements of the reflecting type, and particularly coating methods for such optical elements.

Background Art

A recent discovery has advanced the state of the laser mirror art significantly. Laser mirrors comprising graphite fibers in a glass matrix have been found to provide a laser mirror of low density, high elastic stiffness, high strength, high fracture toughness, low thermal expansion, high thermal conductivity and environmental stability. Noe commonly assigned U. S. Pat. No. 4,256,378, the disclosure of which is incorporated by reference.

In the process of making such mirrors, great difficulty has been encountered in the application of the reflective coatings to these mirrors. In prepatory surface polishing of the optical surfaces of the graphite fiber reinforced glass matrix composite mirror substrates, surface voids up to 15 microns in depth and width have formed. (Note FIG. 1.) Accordingly, when applying the laser radiation reflective coating to the mirror surface, a coating is required which will not only fill these voids, but can be polished back to a specular finish of radiant energy reflecting quality.

Other desirable attributes of a coating in this environment include good adhesion to the mirror substrate, preferably a low processing temperature, coefficients of thermal expansion matched as closely as possible to the mirror substrate, and a coating which is polishable to an optical finish, preferably utilizing conventional techniques.

Surprisingly, the very qualities which make the improved laser mirror substrates described above superior in this area contribute to the difficulties in applying the optically reflective coating. For example, conventional chemical vapor deposition which is generally used in this art, requires relatively high substrate temperatures for deposition. But since the fiber reinforced glass mirror substrates are so dimensionally stable over a wide range of temperatures, upon cooling the thus deposited films shrink, crack and spall from the mirror substrate surface. Accordingly, until now vacuum deposition techniques have been used at low temperatures, but these deposition rates are so slow as to be impractical for building films up to the several mil thickness required to fill the substrate voids which occur upon polishing. Furthermore, additional build-up in coating thickness is desirable so as to be tolerant to the subsequent removal of the coating material which takes place when the mirrors are polished.

In addition to the recent graphite-glass mirror substrates, improved coating methods would also be advantageous for such conventional mirror substrates as molybdenum and silicon carbide. Obtaining a smooth finish on silicon carbide, being a very hard substance, is both very expensive and highly labor intensive. And molybdenum is only polishable up to about a 50 Å rms surface finish.

Commonly assigned, copending application Ser. No. 291,851, filed Aug. 10, 1981, entitled "Coated Laser Mirror and Method of Coating", the disclosure of which is incorporated by reference, describes an improved coating method for overcoming the above cited problems. By applying an amorphous silicon and/or an amorphous germanium coating by plasma enhanced chemical vapor deposition to the laser mirror substrate, an intermediate bond layer is formed which is adherent, void-filling and highly polishable. However, even in this process, voids sometimes occur. This is generally the result of defects in the mirror substrate being coated. These defects can be a result of the weave of the graphite fibers in the case of a graphite glass composite mirror, or particles of metal or other impurities left from a previous grinding operation. Such defects cause spurious nucleation resulting in a faster silicon or germanium deposition rate at isolated points. Such a faster silicon deposition at one point results in silicon or germanium starvation at another, thus producing the voids in the deposited film. These voids are detachablewith a high power microscrope inspection.

Accordingly, what is needed in this art is a method of healing such voids in a relatively simple operation.

DISCLOSURE OF INVENTION

The present invention is directed to a method of repairing surface defects in an amorphous silicon or amorphous germanium deposited coating. The process comprises filling the surface defects with a silicon or germanium oxide. This can be done by plasma oxidizing the amorphous coating applied or by separately depositing the silicon or germanium oxide, or a combination of the two steps. Either the oxidation or the silicon oxide or germanium oxide deposition is accomplished by utilizing plasma enhanced chemical vapor deposition.

The foregoing, and other features and advantages of the present invention, will become more apparent from the following description and accompanying drawing.

BRIEF DESCRIPTION OF THE DRAWINGS

FIG. 1 shows a laser mirror according to the present invention after surface polishing and before coating.

FIG. 4 shows the mirror surface after coating.

BEST MODE FOR CARRYING OUT THE INVENTION

Figure 2:
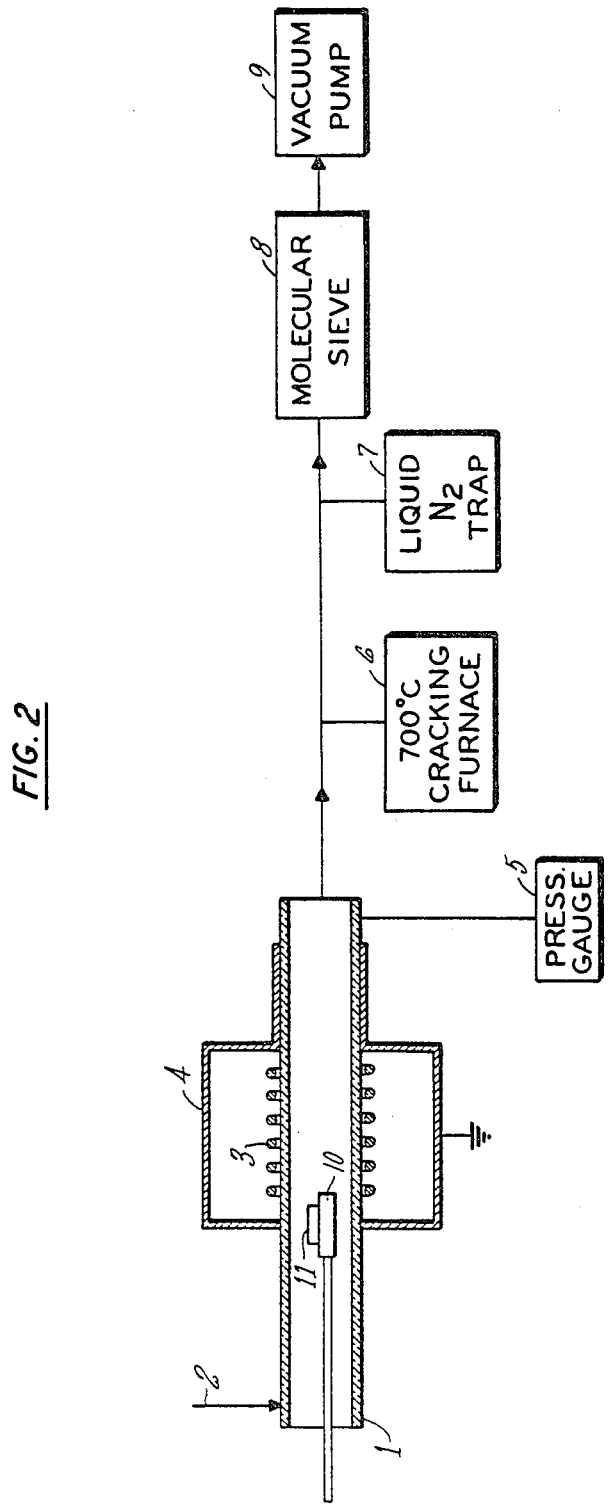
FIGS. 2 and 3 show schematically apparatus useful for coating mirrors according to the present invention.

Although the process according to the present invention can be used on any surface where a highly polishable coating is desired, the process has particular applicability in the laser mirror field and those fields where high reflectivity is important. And while distinct advantages are imparted to conventional mirror substrates such as molybdenum and silicon carbide, the process has particular applicabiltiy to graphite fiber reinforced glass mirror substrates.

It should also be noted that while this invention is described in terms of healing surface defects in an amorphous silicon or amorphous germanium coating on a laser mirror substrate, this process is suitable for healing such defects wherever such coatings are deposited.

As described in U. S. Pat. No. 4,256,378, any graphite fiber with the requisite high strength and good modulus of elasticity can be used in these laser mirrors coated according to the present invention. Hercules HMS graphite fiber and Celanese GY70 graphite fibers are particularly suitable. The fibers are used in the glass matrix at about 40% to about 70% by volume based on the graphite glass composite, and preferably at about 60% by volume.

The glass matrix used is particularly selected to have a very low coefficient of thermal expansion, preferably matched closely, but not equal to that of the graphite fibers used since the graphite has a highly negative axial coefficient of thermal expansion, and the glass has a positive but small coefficient of thermal expansion. Particularly suitable for the purpose of the present invention is a borosilicate glass such as Corning Glass Works CGW 7740.

And while a variety of methods may be used to produce these laser mirror substrates, to be coated according to the present invention, the preferred method is that described in the above cited patent and comprises passing the graphite fibers through a slip of the powdered glass and solvent to impregnate the fibers. The fibers are then wound on a drum and dried, removed from the drum and cut into strips up to the diameter of the mirror to be fabricated. While typical test samples made were about ten centimeters in diameter, mirrors up to twenty centimeters in diameter have also been treated by the processes according to the present invention. However, mirrors of even larger diameters can be made according to the present invention. The fibers are then laid in alternating ply stacks of any orientation desired such as 0° and 45°; 0°, 45° and 90°; 0°, 30°and 90°; 0° and 60°, etc., with 0° and 90° being preferred. The assembled composite is then hot pressed either under vacuum or inert gas such as argon on metal dies coated with colloidal boran nitride or graphite dies sprayed with boron nitride at pressures of 6.9–13.8 MPa (1000–2000 psi) at temperatures of 1050°–1450° C.

Initial polishing is then done with conventional polishing equipment and grinding apparatus. Generally at this time, under such surface polishing, surface voids in excess of 15 microns in depth and width develop. Note FIG. 1. This is a consequence of the breaking and pulling away of the graphite fibers at the surface during this polishing operation. The intermediate bond coating operation according to the present invention, as discussed above, in addition to having the advantages of good adhesion of coating material to the mirror substrate, relatively low processing temperature, coating coefficients of thermal expansion compatible with the mirror substrate and easy polishability with conventional polishing techniques after application, also has the ability to fill these voids securely. This is done by plasma enhanced chemical vapor deposition of amorphous silicon, amorphous germanium, or mixtures thereof in any relative proportions desired.

By plasma enhanced chemical vapor deposition is meant the plasma excitation of a low pressure chemical vapor deposition system. This provides for effectively high gas temperature which results in the pyrolysis of the reactant gas while still being able to maintain a low substrate temperature for deposition of the coating. Deposition conditions (gas pressure, flow rate and substrate temperature) can be adjusted to provide for the deposition of a stress-free film. This is a key factor contributing to the highly polishable nature and adherence of the intermediate bond layer deposited according to the present invention. In order to accomplish this stress-free coating, a narrow range of deposition conditions should be utilized. For example, utilizing an about 1% to about 5% by volume reactive gas content and a 13.5 MHz induction coil at power levels of approximately 100 watts for excitation, a pressure of about 1 torr at a temperature of about 200° C. and total system flow rate of about 100–200 cc per minute should be used. These are the same conditions which can be used for the oxide deposition.

An apparatus useful for applying the plasma enhanced chemical vapor deposition coatings is shown schematically in FIG. 2. In this FIG., the initially polished mirror substrate 11 is placed on support 10 in quartz reactor 1. The substrate can be rotated during deposition to ensure a uniformly deposited layer. The reactant gas enters the system as indicated by arrow 2. The high frequency coil 3 is contained in the metal shield 4 is used for plasma excitation. Pressure guage 5 is used to monitor the reaction conditions. Excess reactants are trapped in cracking furnace 6 and liquid nitrogen trap 7 and molecular sieve 8. A vacuum is maintained by means of vacuum pump 9. In this embodiment, the mirror substrate supported upstream of the gas by a flat quartz holder 10 is placed 3 inches (7.62 cm) from the center of a sixturn rf coil, and held at 200° C. by an externally controlled resistance heater during deposition. The 1.0 meter long horizontal quartz reactor tube, having a 42 mm inner diameter, was surrounded with a grounded metal shield to ensure a uniform silane-helium plasma. Pressure conditions of about a 1 to 10 torr may be used, but best results are obtained with a total pressure of about 1 torr for deposition. And while any thickness of coating may be deposited, in general, coating thicknesses of at least 15 microns are deposited, and preferably in the range of 3–5 mils.

Figure 3:
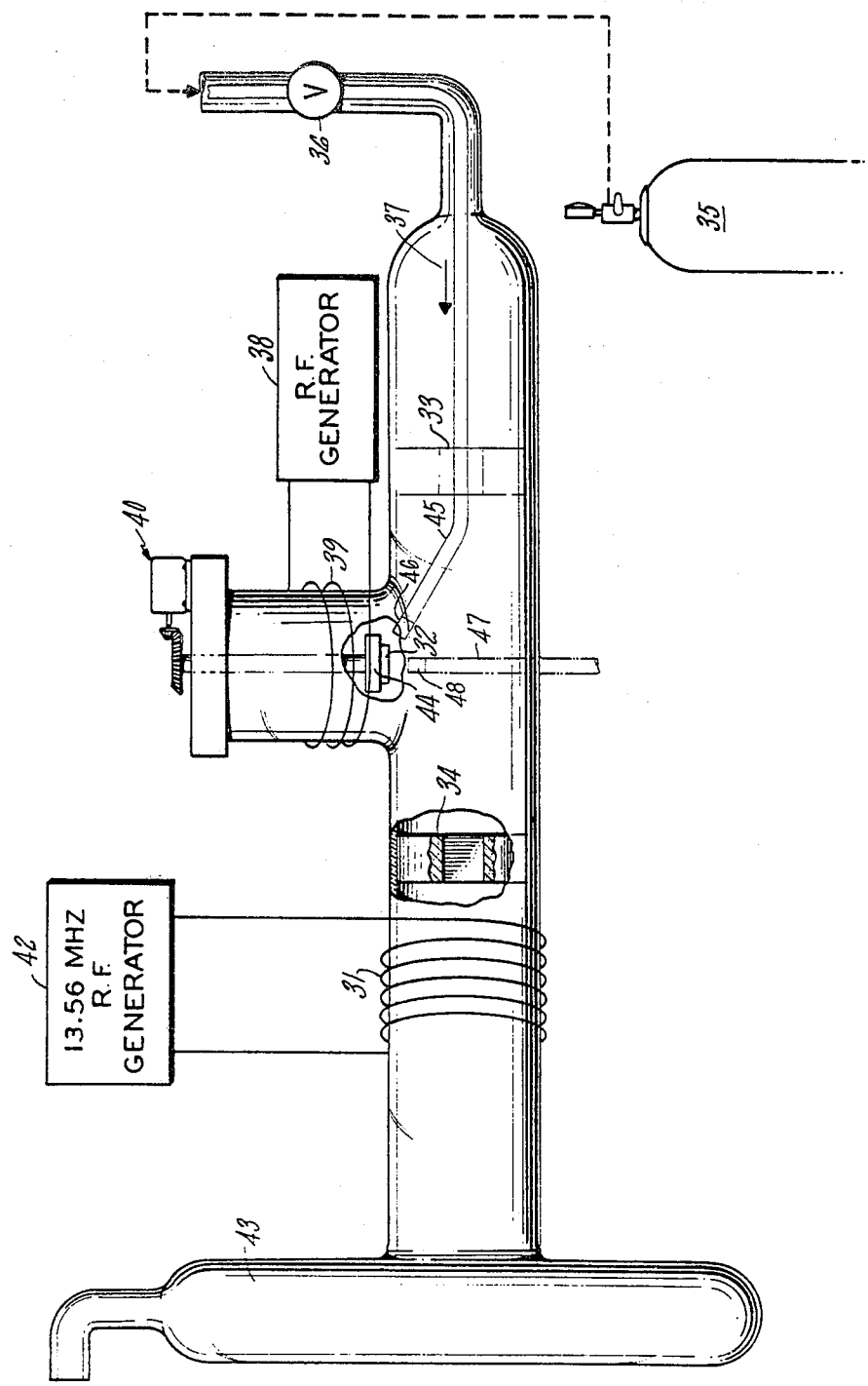
Figure 5:
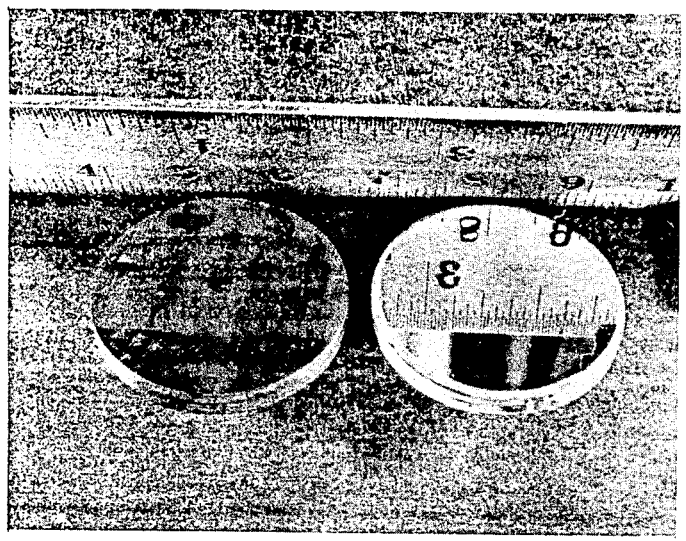
FIG. 5 shows the coated mirror before and after polishing.

This (FIG. 2) represents a conventional plasma enhanced vapor deposition apparatus particulary adapted for the use described herein. However, best results have been obtained with a novel reactor geometry developed specifically for the deposition of amorphous silicon and germanium at rates which are nearly an order of magnitude greater than that which can be obtained with the best commercial systems. Note FIG. 3. For example, with the best commercial systems depositions of 180–200 Å per minute at 200° C. have been obtained. However, employing the reactor geometry described herein, a deposition rate of 1700 Å per minute at 200° C. has been obtained. Furthermore, an increase in temperature in the reactor results in a corresponding increase in deposition rate. The key to obtaining such rates is the unique manner in which inductive coupling is employed for plasma excitation, whereas typical commercial systems primarily employ capacitive coupling for plasma excitation. The plasma excitation is performed by employing the plasma excitation downstream (31) of the piece to be coated (32). Secondly, inserts (33 and 34) which reduce the cross sectional area of the reactor tube are also used. The inserts are generally identical in shape with an outer diameter substantially the same as the inner diameter of the reaction tube. For example, in the apparatus described above, the inserts had an outer diameter of about 45 mm, doughnut-shaped with a rectangular opening in the center with dimensions of 0.5 by 1.5 inches (1.27 by 3.81 cm). Other materials such as quartz or metals stable in this environment may also be used. The insertion of these units results in nearly a four-fold increase in deposition rate. The upstream insert (33) is believed to introduce turbulence to the gas flow and the downstream insert (34) provides not only turbulence, but functions as a barrier for controlling back diffusion of excited species in the deposition area. The remainder of the apparatus as shown in FIG. 3 is indicated by a silane or germane source tank 35 controlled by valve 36, which results in gas flow in the direction shown by arrow 37. The rf generator 38 is a 250 to 400 kilocycle commercial rf induction heating generator which provides the source power for induction heating coil 39. Although an inductive rf coupler is shown as the heat source in this apparatus, other conventional heat sources such as reistance heating and radiant heating can be used.

The temperature ranges used in the process according to the present invention will depend on the heat source used. For resistance heating, temperatures of room temperature to 500° C. can be used. For rf coupling (inductive heating), room temperature to the melting temperature of the substrate can be used; and for radiant heating, room temperature to 650° C. can be used. A conventional drive motor 40 is used to rotate the substrate 32 which is preferably placed on the base 44 in an inverted position to prevent any extraneous materials from inadvertently dropping onto the substrate during the coating operation. The essential feature of the apparatus according to the present invention is the use of the inductive coil 31 downstream of the gas flow and substrate being coated. An rf generator 42 in conjunction with 31 provides the necessary plasma excitation. A trap 43 is used to collect any extraneous conductive particulate material. The remainder of the system can be as shown by characters 5-9 in FIG. 2.

Generally, the systems are run at reduced pressures of about 1 torr, utilizing gas mixtures of about 1% to about 5% $SiH_4$ or $GeH_4$ in an inert gas such as helium, nitrogen, argon, etc. While silane and germane are the preferred reactant gases, any volatilizable silicon or germanium compound may be employed. The power requirements are matched to the size of the system with smaller volume systems requiring lesser power inputs and larger volume systems having greater power requirements.

By this process, not only does the silicon film deposited adequately fill the mirror voids, but a surface roughness is produced which is no more than approximately 3 microns. At this point, conventional mechanical or chemical polishing techniques can be employed producing a highly specular, void-free surface suitable for mirror fabrication. For example, conventional molybdenum laser mirror substrates generally polish up to a 50 Å rms or greater surface finish. However, with the amorphous silicon and germanium coatings according to the present invention, surface finishes of about 10 to about 15 Å rms can be obtained.

FIG. 3 shows the surface of the mirror after deposition, and FIG. 4 shows, left to right, the mirror before and after the final conventional polishing step. As the outermost reflective coating, any conventional reflective coating, in the infra-red, visible ultraviolet, laser, etc. range may be deposited once the highly polished intermediate layer is formed. This can include such things as gold; gold, silver or aluminum overcoated with thorium tetrafuoride; gold, silver, or aluminum overcoated with silicon oxide or magnesium fluoride; and multi-layered dielectric coatings such as alternating layers of one quarter optical wavelength thickness of zinc sulfide and thorium tetrafluoride.

Figure 6:
FIG. 6 shows a cross-sectional view of a silicon dioxide silicon interface with a void closed by the process according to the present invention.

In FIG. 6, 61 indicates the void formed in the amorphous silicon coating 62. The deposited silicon dioxide is indicated as 63. In this particular example, the void was 10 microns deep and 1 micron in width. This particular void was filled during the amorphous silicon deposition by simply leaking in about 1% to about 3% volume percent oxygen during the silicon deposition. While air was used as the source of the oxygen in this particular example, pure oxygen, and preferably nitrous oxide or other oxygen containing compound should be used since oxygen and silane are so reactive, and explosively so under the proper conditions.

The oxides formed by introduction of the oxidizing gas are either silicon dioxide (germanium dioxide) or other silicon (or germanium) rich oxides. If pure oxygen is used as the oxidizing gas as opposed to an oxygen compound such as nitrous oxide, the oxygen gas should be diluted with an inert gas such as nitrogen. The gas should be introduced in the gas reaction zone, i.e. the area immediately surrounding the substrate (e.g. 11 in FIG. 2 and 32 in FIG. 3). This can be accomplished by utilizing a concentric tube 45 with a diffuser 46 or a separate gas inlet 47 with diffuser 48 as shown in FIG. 3.

This process is particularly suitable for repairing high aspect ratio voids, i.e. large depth as compared to its width. Note FIG. 6. If the void is of relatively small width, oxidation of the already deposited amorphous coating is sufficient, and in those cases where the voids are of larger size, the silicon oxide or germanium oxide coatings are deposited in sufficient thickness to completely cover the void. It is also possible to begin with an oxidation of the substrate containing the voids, and as a subsequent step, deposit an oxide coating.

The silicon (or germanium) oxide healing process can be performed at any point in the mirror finishing operation. For example, detected surface voids can be healed, the silicon dioxide surface polished back, and additional amorphous silicon deposited. Alternatively, the silicon dioxide can be deposited, the above described polishing performed, and the ultimate reflective coating applied thereafter. It is also possible to finish polish the intermediate coating and then apply the silicon dioxide to fill any voids which may have errupted during the polishing operation. In some instances, where voids are not clearly detectable prior to this finishing operation, the healing process can be performed to insure that such defects are not prevalent. At this point, the silicon dioxide can optionally be polished back to the amorphous silicon, if desired.

Although this invention has been shown and described with respect to detailed embodiments thereof, it will be understood by those skilled in the art that various changes in form and detail thereof may be made without departing from the spirit and scope of the claimed invention.

We claim:
1. The method of repairing surface defects in an amorphous silicon or amorphous germanium deposited coating on a laser mirror substrate comprising forming an oxide layer of the silicon or germanium on the deposited coating by plasma enhanced chemical vapor deposition.

2. The method of claim 1 wherein the oxide coating is formed by introducing a source of reactive oxygen into the process during the vapor deposition of the amorphous silicon or amorphous germanium coating.

3. The method of claim 1 wherein the oxide surface is formed by plasma oxidation of the already deposited amorphous coating in the chemical vapor deposition chamber.

4. The method of claim 1 wherein the formed oxide coating is removed except in the defect areas by polishing back to the amorphous silicon or germanium coating.

5. The method of claim 2 wherein amorphous silicon or amorphous germanium deposition is continued after the oxide layer is formed.

6. The method of claim 1 wherein after polishing, the surface has a surface finish of about 10 to about 15 Å rms.

7. The method of claim 1 wherein the amorphous silicon or amorphous germanium is at least 15 microns thick.

8. The method of claim 1 including depositing a laser radiation reflecting outer layer on the repaired surface.

9. The method of claim 1 wherein the mirror substrate comprises graphite fiber reinforced glass, silicon carbide or molybdenum.

10. The method of claim 1 wherein the deposited coating is amorphous silicon.

* * * * *